US006765437B2

(12) United States Patent
Goutti et al.

(10) Patent No.: US 6,765,437 B2
(45) Date of Patent: Jul. 20, 2004

(54) AUDIO AMPLIFYING CIRCUIT

(75) Inventors: Frédéric Goutti, Grenoble (FR); Christophe Forel, Grenoble (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/264,942

(22) Filed: Oct. 4, 2002

(65) Prior Publication Data

US 2003/0067350 A1 Apr. 10, 2003

(30) Foreign Application Priority Data

Oct. 5, 2001 (FR) .............................................. 01 12864

(51) Int. Cl.[7] ................................................. H03F 1/14
(52) U.S. Cl. ........................................... 330/51; 330/69
(58) Field of Search ........................... 330/51, 69, 141, 330/149; 381/94.5

(56) References Cited

U.S. PATENT DOCUMENTS 5,703,529 A * 12/1997 Ghaffaripour et al. ........ 330/51

FOREIGN PATENT DOCUMENTS

| EP | 0 043 707 A1 | 1/1982 |
| EP | 0 106 953 A1 | 5/1984 |
| EP | 0 185 412 A1 | 6/1986 |
| EP | 0 299 665 A2 | 1/1989 |

* cited by examiner

*Primary Examiner*—Steven J. Mottola
(74) *Attorney, Agent, or Firm*—Lisa K. Jorgenson; E. Russell Tarleton; Seed IP Law Group PLLC

(57) ABSTRACT

An amplifying circuit receiving an input voltage and a reference voltage equal to a fraction of the circuit supply voltage, the reference voltage provided by a time constant circuit, including a circuit for, upon power-on, inhibiting the amplifying circuit for as long as the difference between the value of the provided reference voltage and the voltage at the output of the time constant circuit is greater than a determined threshold.

20 Claims, 3 Drawing Sheets

AUDIO AMPLIFYING CIRCUIT

BACKGROUND OF THE INVENTION

1. Field of the Invention

The present invention relates to an amplifying circuit used in audio systems.

2. Description of the Related Art

FIG. 1 shows a conventional bridge-connected audio amplifying circuit. The amplifying circuit includes first and second operational amplifiers 11, 12, connected as inverting amplifiers. The inverting input (−) of amplifier 11 is connected to an input terminal E of the system via a resistor 13 and a coupling capacitor 14 connected in series. Output O1 of amplifier 11 is connected to the inverting input (−) via a resistor 15. The inverting input (−) of amplifier 12 is connected to output O1 of amplifier 11 via a resistor 16 and to its output O2 via a resistor 17. Outputs O1 and O2 of amplifiers 11, 12 are connected across a load 18, typically a loudspeaker able to give out sounds according to the current flowing therethrough. The non-inverting inputs (+) of amplifiers 11, 12 are connected together to a node BP of a resistive divider including a resistor 19 connected between node BP and a supply terminal VCC, and a resistor 20 connected between node BP and ground GND. A capacitor 21 is connected in parallel with resistor 19. Capacitor 21 has the function of filtering the noise generated by resistors 19 and 20 and for absorbing possible variations of the voltage at supply terminal VCC.

The gain of amplifier 11 is given by the ratio of resistances 15 and 13. The gain of second amplifier 12 is generally chosen to be equal to −1 by setting an identical value for both resistances 16 and 17.

The expression of voltage $V_{CH}$ across load 18 is given by the following equation:

$$V_{CH} = V_{O1} - V_{O2} = -2(R_{15}/R_{13}) * (V_M - V_{BP})$$

where $R_{13}$ and $R_{15}$ are the respective values of resistances 13 and 15; and $V_{O1}$, $V_{O2}$, $V_{BP}$, and $V_M$ are the voltages at outputs O1 and O2 of amplifiers 11, 12, at node BP, and at a node M between capacitor 14 and resistor 13, respectively.

The divider formed of resistors 19 and 20 sets the voltage at node BP to a reference voltage. For example, the reference voltage may be chosen to be equal to VCC/2 and the values of resistances 19, 20 are then set to a same value. In normal operation, in the absence of a signal at input terminal E, voltages $V_M$ and $V_{BP}$ are equal to the reference voltage and the voltage across the load is zero. When a voltage is applied to input terminal E, voltage $V_M$ is equal to the reference voltage plus the variable component of the input voltage, coupling capacitor 14 suppressing the D.C. component of the input voltage.

Accordingly, the voltage across load $V_{CH}$ is equal to the variable component of the input voltage multiplied by amplification gain $-2R_{15}/R_{13}$. By choosing an adapted ratio of the values of resistances 15 and 13, the peak-to-peak load voltage can be significantly amplified.

FIG. 2 shows a circuit similar to that of FIG. 1 further including a stand-by system 25 having the function of maintaining supply voltage VCC which may be used by stages upstream of the amplifying state, while reducing the specific consumption of the amplifying portion. Stand-by system 25 receives a control signal and is connected at a first output to inhibition terminals A1 and A2 of amplifiers 11 and 12. An output of stand-by system 25 is further connected to a transistor 26 in series with resistor 19. Upon reception of the specific control signal, stand-by system 25 also blocks transistor 26 to suppress the consumption of resistors 19, 20.

FIG. 3 shows the evolution of voltages along time at given points of the amplifying circuit of FIG. 1 at the device power-on, that is, when the supply voltage passes from 0 to voltage $V_{CC}$. Curve $V_{ALIM}$ shows the variation of the supply voltage along time. Curve $V_M$ shows the variation of the voltage at node M along time, curve $V_{BP}$ showing the variation of the voltage at node BP along time.

At the circuit power-on, supply voltage $V_{ALIM}$ almost instantaneously switches from 0 volt to VCC. The voltage at node BP settles at the reference voltage. The voltage at node $V_M$ also settles at the reference voltage, for example, VCC/2. It should be noted that curve $V_M$ reaches an equilibrium level in a time shorter than that of curve $V_{BP}$.

The rise time of the voltage at node BP is mainly determined by the values of capacitance 21 and of resistances 19, 20. It generally is on the order of from 50 to 150 ms. It is generally not possible to guarantee an identical time constant "seen" by node M, which implies different rise times for the voltages at nodes M and BP.

On FIG. 4, curve $V_M - V_{BP}$ shows the difference between the voltages at nodes M and BP and curve $V_{CH1}$ shows the voltage applied across load 18 for the circuit of FIG. 1.

At the circuit power-on, the operational amplifiers supplied by the supply voltage being almost "instantaneously" on, the difference between the voltages at nodes M and BP is reflected on load 18, multiplied by the amplifying gain. The voltage applied to the load, due to a high amplifying gain, is often sufficient to cause a characteristic audible and unpleasant noise.

In the case where the amplifier is equipped with a stand-by unit 25, the problem is also posed upon switching from the stand-by state to a normal operation state, since in this switching, the voltage at node BP will settle to the reference voltage while the voltage at node M has already settled to the reference voltage.

Upon switching from a normal operating state to a stand-by state or from a normal operation state to an off state, the voltages at nodes M and BP switch from the reference level to a zero voltage in different durations, for the same reasons as mentioned previously. Generally, the supply of amplifiers 11, 12 being "almost-instantaneously" interrupted, said amplifiers no longer amplify directly across the load the difference between the voltages at nodes M and BP. However, amplifiers 11, 12 may stay on, so that a current generated by the difference between the voltages at nodes M and BP could cross the load. However, this current often is very small and only rarely translates as a characteristic audible and unpleasant noise of the loudspeaker. In the case where the switching of the supply voltage from VCC to a zero voltage exhibits a non-negligible time constant, amplifiers 11, 12 and comparator 30 may remain supplied for some time. In this case, the voltage difference at nodes BP and M remains amplified across the load and may be the cause of a characteristic audible and unpleasant noise.

BRIEF SUMMARY OF THE INVENTION

The disclosed embodiment of the present invention provides an audio amplifying circuit that includes a system for reducing unwanted noise appearing at the circuit turning-on from an off state or a stand-by state.

Accordingly, the embodiment of the present invention provides an amplifying circuit having an amplifier circuit that receives an input voltage and a reference voltage circuit to generate a reference voltage equal to a fraction of the circuit supply voltage, a time constant circuit for generating a voltage, the amplifying circuit including means for, upon power-on, inhibiting the amplifier circuit for as long as the difference between the value of the provided reference voltage and the voltage at the output of the time constant circuit is greater than a determined threshold.

According to another feature of the present invention the amplifying circuit includes a first amplifier having a first amplifying gain, receiving at a first input the input voltage, and a second amplifier having a second amplifying gain, and receiving at a first input the output of the first amplifier, the outputs of the first and second amplifiers being connected to a load, second inputs of the first and second amplifiers being connected together to a node receiving the reference voltage.

According to another feature of the present invention, the time constant circuit includes a first resistive divider including a first resistor connected between the node and a high supply terminal and a second resistor connected between the node and a low supply terminal, a capacitive element being connected in parallel across one of the first or second resistors.

According to another feature of the present invention, the means for inhibiting the amplifying circuit include a comparator receiving at a first input the provided reference voltage and connected at a second input to the node, and the output of which controls the setting to high impedance of the first amplifier or of the second amplifier for as long as the difference between the reference voltage and the node voltage is greater than a determined threshold.

According to another feature of the present invention, the means for inhibiting the amplifier circuit include a second resistive divider connected in parallel on the first voltage divider and including third and fourth resistors in series, the first input of the comparator being connected to a node between the third and fourth resistors.

BRIEF DESCRIPTION OF THE SEVERAL VIEWS OF THE DRAWINGS

The foregoing features and advantages of the present invention will be discussed in detail in the following non-limiting description of specific embodiments in connection with the accompanying drawings, wherein FIG. 1, previously described, schematically shows an architecture of a conventional amplifying circuit.

DETAILED DESCRIPTION OF THE INVENTION

Figure 1:
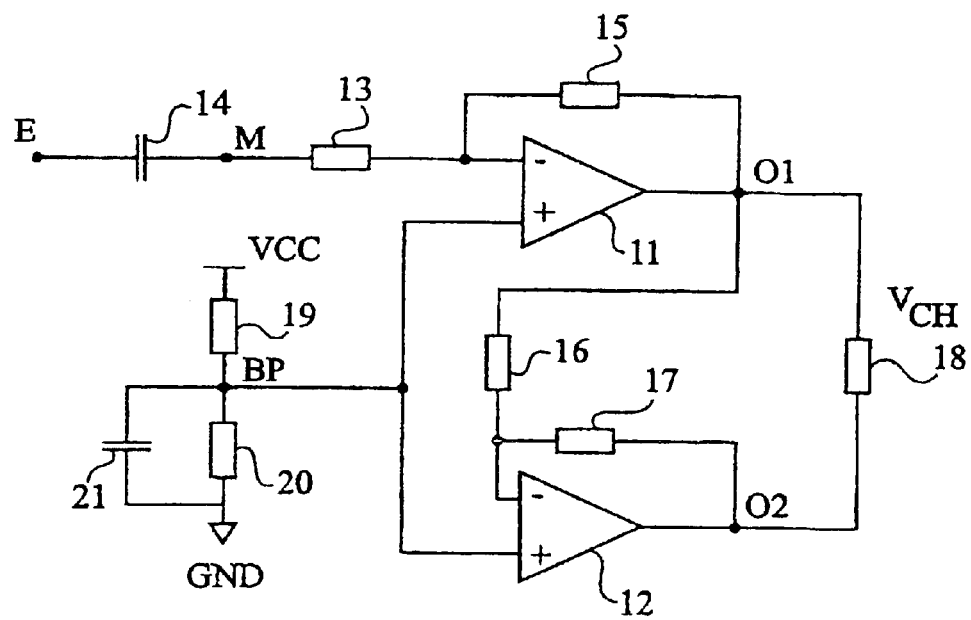
Figure 5:
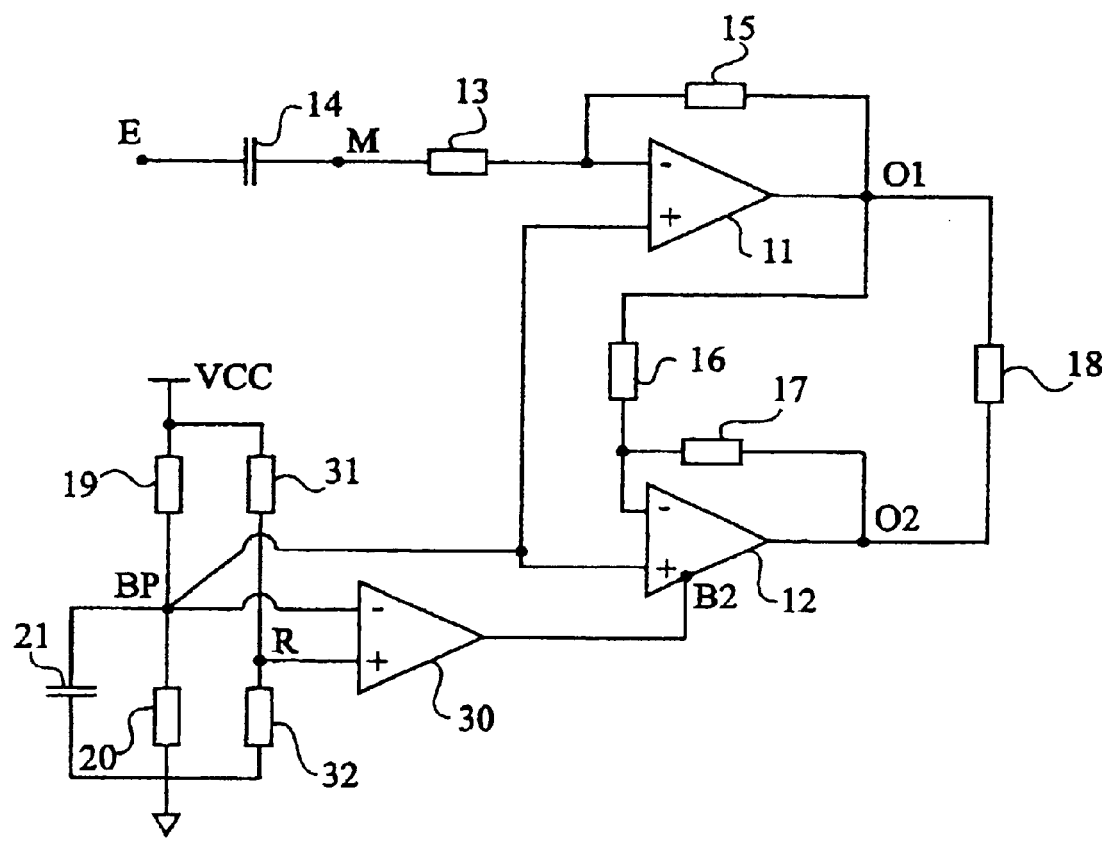
FIG. 5 shows an example of architecture of an amplifying circuit according to the present invention.

In FIG. 5, elements identical to those shown in FIG. 1 are referred to with the same reference numbers.

FIG. 5 shows an example of an architecture of an amplifying circuit according to the present invention. The amplifying circuit shows the arrangement of two bridge-connected amplifiers 11, 12 of FIG. 1.

The difference with the architecture of FIG. 1 is that the amplifying circuit according to the present invention includes a comparator 30, of conventional design and the precise architecture of which will not be detailed any further. Two resistors 31, 32 in series are connected in parallel with resistors 19, 20. The inverting input (−) of comparator 30 is connected to a node BP between resistors 19 and 20 and the non-inverting input (+) of comparator 30 is connected to node R. The output of comparator 30 is connected to a terminal for setting to high impedance one of amplifiers 11, 12. FIG. 5 shows the case where the output of comparator 30 is connected to terminal B2 for setting to high impedance second amplifier 12. The setting to high impedance of an amplifier is a function usually provided and which may correspond, for example, in a known manner, to the switching off of an internal transistor of the amplifier located at the level of the amplifier output.

The ratio of resistances 31, 32 is identical to that of resistances 19, 20. As the amplifying circuit is turned on, that is, as the supply voltage switches from 0 volt to VCC, the settling of the voltage at node R is instantaneous since no capacitor has been placed in parallel with resistors 31, 32. Like for the circuit of FIG. 1, the voltage at node BP settles at the reference voltage after a given delay due to the presence of capacitor 21. As long as the difference between the voltage at node R and the voltage at node BP is greater than a threshold determined by the internal features of comparator 30, the output of comparator 30 is at a high state which controls the setting to high impedance of second amplifier 12 (or of first amplifier 11). The setting to high impedance of amplifier 12 (or of amplifier 11), prevents the running of the current through load 18, which prevents generation of undesirable noise.

When the voltage at node BP is sufficiently close to the voltage at node R, the output of comparator 30 switches to a low state and controls amplifier 12 (or amplifier 11), which returns to a normal operation.

Figure 4:
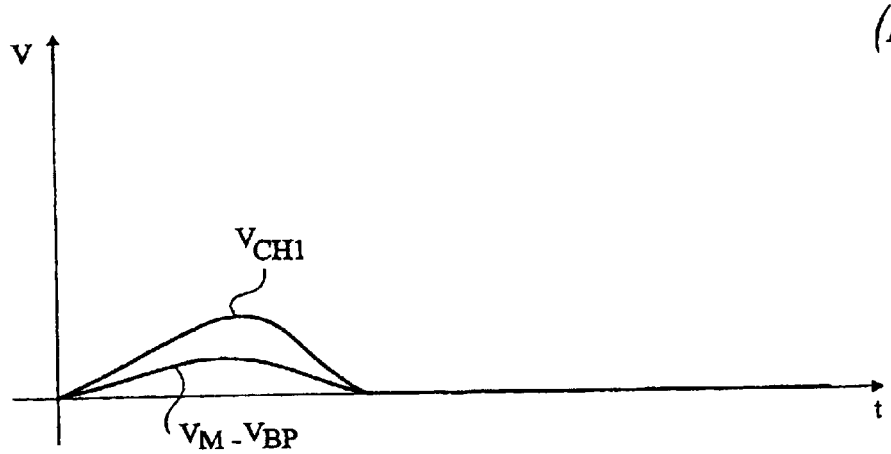
FIG. 4, previously described, similar to FIG. 3, shows the variation of voltages at points of the circuit of FIG. 1.
Figure 6:
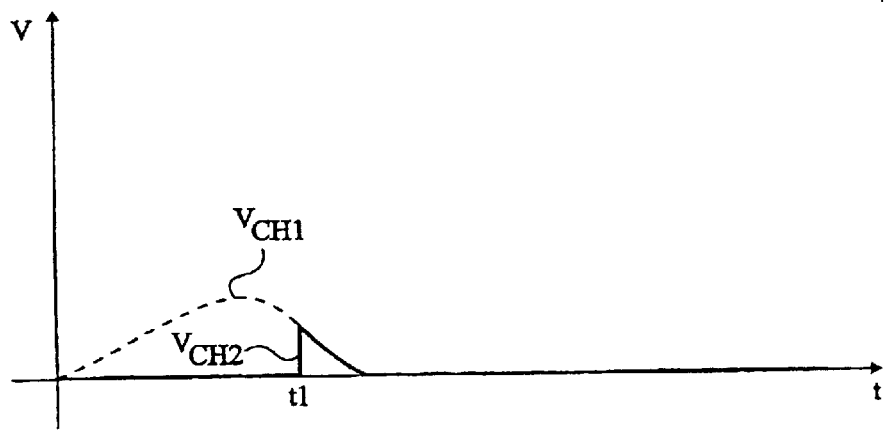
FIG. 6 shows the variation along time of the voltage across the load of the amplifying circuit of FIG. 5.

In FIG. 6, curve $V_{CH2}$ shows the voltage applied to load 18 with an amplifying circuit according to the present invention. Curve $V_{CH1}$ of FIG. 4 is reproduced in dotted lines for comparison. The voltage applied to load 18 clearly appears to be substantially zero until a time t1 which corresponds to the switching to the low state of the comparator. The voltage at node BP is then relatively close to the reference voltage, and thus substantially close to the voltage at node M. The difference between the voltages at nodes M and BP is thus small, and so is the voltage applied on load 18, whereby load 18 generates no undesirable noise.

When comparator 30 is connected to second amplifier 12, the voltage at node O1 of the first amplifier 11 follows the voltage at node M, and thus the voltage at output O2 of the second amplifier 12 follows the voltage at output O1 through the load 18, the first amplifier 11 having a normal operation. Conversely, when comparator 30 is connected to first amplifier 11, the voltage at output O2 of second amplifier 12 follows the voltage at node BP, and thus the voltage at output O1 of first amplifier 11 follows the voltage at output O2 through load 18, the second amplifier 12 having a normal operation.

Figure 2:
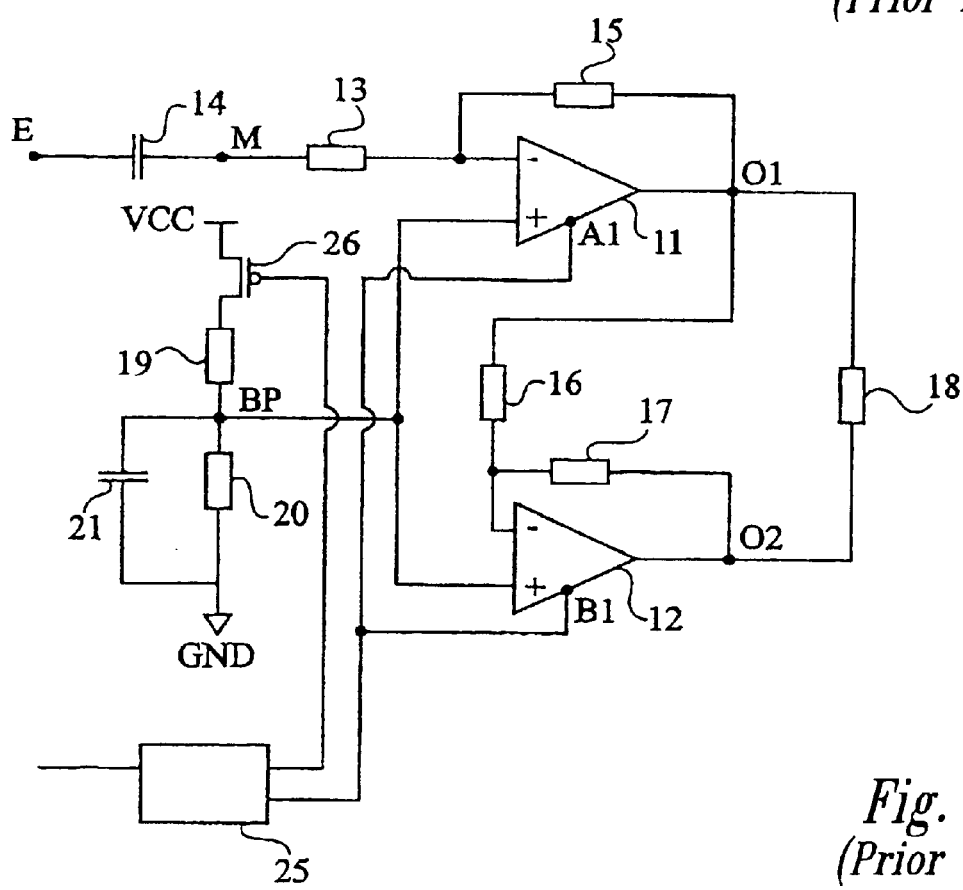
FIG. 2, previously described, shows an architecture similar to that of FIG. 1, the amplifying circuit further including a stand-by system.
Figure 3:
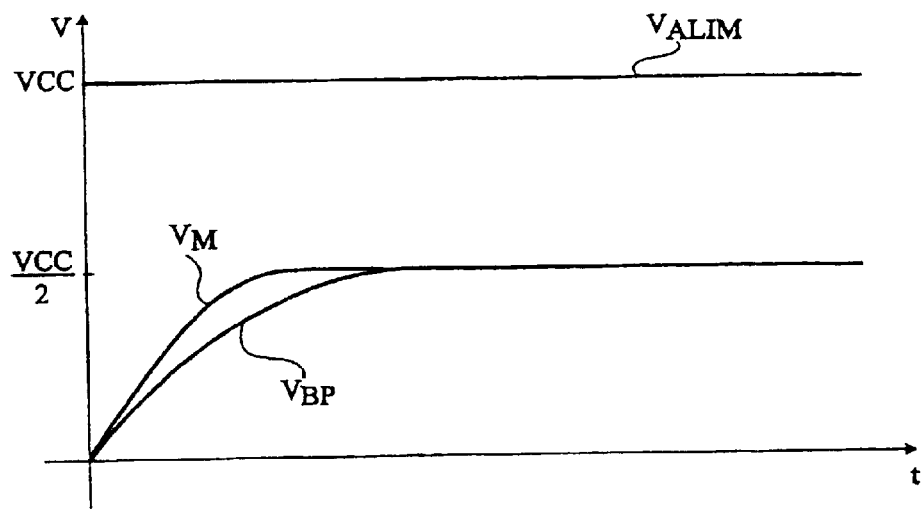
FIG. 3, previously described, shows the variation along time of voltages at points of the circuit of FIG. 1 as the amplifying circuit is turned on from an off state.

The present invention may also apply to the circuit shown in FIG. 2. Indeed, upon switching from a stand-by state to a normal operating state, transistor 26 being on, the operation of comparator 30 is identical to what has been previously described.

Further, in this case, the setting to high impedance of second amplifier 12 (or of first amplifier 11) is thus ensured upon switching from a normal operating state to a stand-by state. Indeed, when stand-by system 25 blocks transistor 26 connected in series with resistor 19, the voltage at node BP drops while the voltage at node R remains at the reference state. Comparator 30 then switches high and controls the setting to high impedance of amplifier 12 (or of amplifier 11). Any running of current through load 18 is thus prevented.

Upon switching from a normal operating state to a completely off state, when the switching of the supply voltage from VCC to a zero voltage is "almost instantaneous," the supply of amplifiers 11, 12 is also "almost instantaneously" interrupted, and said amplifiers thus no longer directly amplify across the load the difference between the voltages at nodes M and BP. The current that may flow through load 18 thus remains very low and generally causes no noise. If the switching of the supply voltage from VCC to a zero voltage exhibits a non-negligible time constant, amplifiers 11, 12 and comparator 30 can remain on for some time. In this case, the voltages at nodes BP and R drop from VCC/2 to 0 volt with different time constants, and the difference between these voltages is sufficient to set the comparator output to the high state, and thus set amplifier 12 (or amplifier 11) to high impedance, thus preventing any current from flowing through load 18.

According to an alternative of the present invention, comparator 30 may include a hysteresis system to avoid that, in possible voltage fluctuations at nodes R and BP, the difference between the voltages at nodes R and BP falls below the determined threshold of comparator 30, causing an undesirable switching to the high state of the output of comparator 30 and controlling the setting to high impedance of second amplifier 12. In this case, comparator 30 includes a second threshold higher than the first threshold so that the output of comparator 30 switches from the high state to the low state if the difference between the voltage at node R and the voltage at node BP decreases short of the first threshold, but the output of comparator 30 only switches from the low state to the high state if the difference between the voltage at node R and the voltage at node BP increases and exceeds the second threshold.

The present invention provides a system enabling suppression of undesirable noise upon turning-on of an amplifier circuit from an off state or a stand-by state, and conversely. The circuit provided by the present invention is particularly simple to implement and can easily adapt on an already existing system without causing significant modifications.

Of course, the present invention is likely to have various alterations, modifications, and improvements which will readily occur to those skilled in the art. In particular, the resistive divider may be set so that the voltage at node BP is any fraction of the supply voltage which corresponds to the reference voltage of the voltage at node M.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An amplifying circuit comprising a first amplifier having a first amplifying gain, an output, and receiving at a first input an input voltage, and a second amplifier having a second amplifying gain, an output, and receiving at a first input an output signal of the first amplifier, the outputs of the first and second amplifiers connected to a load, wherein the output of the first amplifier is connected to the first input of the first amplifier and wherein second inputs of the first and second amplifiers, distinct from the first inputs, are connected together to a node receiving a reference voltage equal to a fraction of the circuit supply voltage and provided by a time constant circuit and wherein the amplifying circuit comprises means for, upon power-on, inhibiting the first amplifier or the second amplifier for as long as the difference between the value of the provided reference voltage and the voltage at an output of the time constant circuits is greater than a determined threshold.

2. The amplifying circuit of claim 1 wherein the time constant circuit comprises a first resistive divider having a first resistor connected between the node and a high supply terminal and a second resistor connected between the node and a low supply terminal, and a capacitive element connected in parallel across one of the first or second resistors.

3. The amplifying circuit of claim 2 wherein the means for inhibiting the amplifying circuit include a comparator receiving at a first input the provided reference voltage and connected at a second input to the node, and the output of which controls the setting to high impedance of the first amplifier or of the second amplifier for as long as the difference between the provided reference voltage and the voltage at the node is greater than a determined threshold.

4. The amplifying circuit of claim 3 wherein the means for inhibiting the amplifier circuit comprises a second resistive divider connected in parallel on the first voltage divider and third and fourth resistors connected in series, the first input of the comparator being connected to a node between the third and fourth resistors.

5. The amplifying circuit of claim 3 wherein the comparator comprises a hysteresis comparator.

6. The amplifying circuit of claim 1, comprising a stand-by system for controlling a setting to low consumption of the first and second amplifiers.

7. The amplifying circuit of claim 6 wherein the stand-by system also controls a switching element placed in series with the first resistor.

8. An amplifying circuit, comprising:
a reference voltage circuit that generates a reference voltage;
a time constant circuit that generates a voltage;
an amplifier circuit that receives an input voltage and generates an output voltage, the amplifier circuit comprising first and second amplifiers; and
an inhibiting circuit that inhibits one of either the first and second amplifiers when a difference between the voltage from the time constant circuit and the reference voltage is greater than a determined threshold voltage.

9. The amplifying circuit of claim 8 wherein the inhibiting circuit comprises a comparator having a first input for receiving the reference voltage and a second input for receiving the voltage from the time constant circuit, and an output coupled to the amplifier circuit.

10. The amplifying circuit of claim 8 wherein the time constant circuit comprises a first resistor coupled to a first voltage source and to a first node, a second resistor coupled to the first node and to a ground reference, and a capacitor coupled in parallel with the second resistor; and the reference voltage circuit comprises a first resistor coupled between the voltage source and a second node, and a second resistor coupled between the second node and the ground reference, and wherein the first node is coupled to an inverting input of the comparator and the second node is coupled to a non-inverting input of the comparator.

11. The amplifying circuit of claim 10 wherein the output of the comparator is coupled to a disabling input of one of the first and second amplifiers for disabling the one of the first and second amplifiers for as long as the difference between the voltage from the time constant circuit and the reference voltage is greater than the determined threshold voltage.

12. An inhibiting circuit for an amplifier circuit having first and second amplifiers, the inhibiting circuit comprising:
  a reference voltage circuit that generates a reference voltage;
  a time constant circuit that generates a voltage; and
  a comparator having a first input coupled to the reference voltage circuit and a second input coupled to the time constant circuit and an output coupled to one of the first and second amplifiers and configured to generate a disabling signal to the one of the first and second amplifiers when a difference between the voltage from the time constant circuit and the reference voltage is greater than a determined threshold voltage.

13. The inhibiting circuit of claim 12 wherein the comparator is configured to established the determined threshold voltage.

14. An amplifying circuit, comprising:
  a reference voltage circuit configured to generate a reference voltage;
  a time constant circuit coupled in parallel to the reference voltage circuit and configured to generate a voltage;
  a comparator having a non-inverting input coupled to the reference voltage circuit and an inverting input coupled to the time constant circuit and configured to generate on an output an inhibiting signal when a difference between the voltage from the time constant circuit and the reference voltage is greater than a determined threshold voltage; and
  an amplifier circuit comprising a first amplifier having a first amplifying gain and receiving at a first input an input voltage and a second amplifier having a second amplifying gain and receiving at a first input an output of the first amplifier, the outputs of the first and second amplifiers connected to a load, the first and second amplifiers further including second inputs that are each connected to the time constant circuit, and one of the first and second amplifiers coupled to the output of the comparator and configured to be inhibited upon receipt of the inhibiting signal from the comparator.

15. The amplifying circuit of claim 14 wherein the comparator is configured to establish the determined threshold voltage.

16. The amplifying circuit of claim 15 wherein the reference voltage circuit comprises first and second resistors coupled in series between a voltage source and a ground reference and to each other at a first node, and the time constant circuit comprises first and second resistors coupled to the voltage source and the ground reference and to each other at a second node and a capacitor coupled in parallel with the second resistor.

17. The amplifying circuit of claim 16 wherein the first and second resistors of the reference voltage circuit have the same values as the first and second resistors of the time constant circuit, respectively.

18. An amplifying circuit comprising a first amplifier having a first amplifying gain, an output, and receiving at a first input an input voltage, and a second amplifier having a second amplifying gain, an output, and receiving at a first input an output signal of the first amplifier, the outputs of the first and second amplifiers connected to a load, wherein the output of the first amplifier is connected to the first input of the first amplifier and wherein second inputs of the first and second amplifiers, distinct from the first inputs, are connected together to a node receiving a reference voltage equal to a fraction of the circuit supply voltage and provided by a time constant circuit, the time constant circuit comprising a first resistive divider having a first resistor connected between the node and a high supply terminal and a second resistor connected between the node and a low supply terminal, and a capacitive element connected in parallel across one of the first or second resistors, and wherein the amplifying circuit comprises means for, upon power-on, inhibiting the amplifier circuit for as long as the difference between the value of the provided reference voltage and the voltage at an output of the time constant circuit is greater than a determined threshold, wherein the means for inhibiting the amplifying circuit include a hysteresis comparator receiving at a first input the provided reference voltage and connected at a second input to the node, and the output of which controls the setting to high impedance of the first amplifier or of the second amplifier for as long as the difference between the provided reference voltage and the voltage at the node is greater than a determined threshold.

19. An amplifying circuit comprising a first amplifier having a first amplifying gain, an output, and receiving at a first input an input voltage, and a second amplifier having a second amplifying gain, an output, and receiving at a first input an output signal of the first amplifier, the outputs of the first and second amplifiers connected to a load, wherein the output of the first amplifier is connected to the first input of the first amplifier and wherein second inputs of the first and second amplifiers, distinct from the first inputs, are connected together to a node receiving a reference voltage equal to a fraction of the circuit supply voltage and provided by a time constant circuit and wherein the amplifying circuit comprises means for, upon power-on, inhibiting the first or the second amplifier for as long as the difference between the value of the provided reference voltage and the voltage at an output of the time constant circuit is greater than a determined threshold, wherein the means for inhibiting the amplifying circuit include a hysteresis comparator receiving at a first input the provided reference voltage and connected at a second input to the node, and the output of which controls the setting to high impedance of the first amplifier or of the second amplifier for as long as the difference between the provided reference voltage and the voltage at the node is greater than a determined threshold.

20. An amplifier circuit, comprising:
  a reference voltage circuit configured to generate a reference voltage;
  a time constant circuit configured to generate a time constant voltage;
  an amplifier circuit that receives an input signal and generates an output signal in response thereto; and
  an inhibiting circuit that inhibits the amplifier circuit when a difference between the voltage from the time constant circuit and the reference voltage is greater than a determined threshold voltage, the inhibiting circuit comprising a hysteresis comparator having a first input for receiving the reference voltage and a second input for receiving the voltage from the time constant circuit, and an output coupled to the amplifier circuit.

* * * * *

UNITED STATES PATENT AND TRADEMARK OFFICE
CERTIFICATE OF CORRECTION

PATENT NO. : 6,765,437 B2
DATED : July 20, 2004
INVENTOR(S) : Frédéric Goutti et al.

It is certified that error appears in the above-identified patent and that said Letters Patent is hereby corrected as shown below:

<u>Column 6,</u>
Line 12, "time constant circuits" should read as -- time constant circuit --.

Signed and Sealed this

Seventh Day of December, 2004

JON W. DUDAS
*Director of the United States Patent and Trademark Office*